(12) United States Patent
Yang

(10) Patent No.: US 12,740,409 B2
(45) Date of Patent: Sep. 15, 2026

(54) HEAT DISSIPATION MODULE

(71) Applicant: CLEVO CO., New Taipei City (TW)

(72) Inventor: Chi-Hsueh Yang, Taipei City (TW)

(73) Assignee: CLEVO CO., New Taipei City (TW)

( * ) Notice: Subject to any disclaimer, the term of this patent is extended or adjusted under 35 U.S.C. 154(b) by 114 days.

(21) Appl. No.: 18/433,270

(22) Filed: Feb. 5, 2024

(65) Prior Publication Data

US 2024/0266242 A1 Aug. 8, 2024

(30) Foreign Application Priority Data

Feb. 6, 2023 (TW) ................................ 112201023

(51) Int. Cl.
*H10W 40/22* (2026.01)

(52) U.S. Cl.
CPC .................................. *H10W 40/22* (2026.01)

(58) Field of Classification Search
CPC ..... H01L 23/367; H01L 23/427; F25D 15/04; F25D 15/06; F25D 15/043; F25D 15/046; A61L 9/037; A61L 9/127; F28D 2021/0029; F28F 2215/04; F28F 2215/10; H10W 40/226; H05K 7/2039; H05K 7/20409
USPC .................................. 165/102, 4.26, 104.33
See application file for complete search history.

(56) References Cited

U.S. PATENT DOCUMENTS 3,532,158 A * 10/1970 Hiebert .................. E04C 2/365 361/701
3,613,778 A * 10/1971 Feldman, Jr. ....... F28D 15/0233 29/890.032
3,680,189 A * 8/1972 Noren ................ F28D 15/0283 29/890.032
3,735,806 A * 5/1973 Kirkpatrick ............... E04B 1/80 165/104.14
6,003,591 A * 12/1999 Campbell ........... F28D 15/0233 165/185
7,051,793 B1 * 5/2006 Schulz-Harder ...... F28D 15/046 165/104.33
7,578,337 B2 * 8/2009 Spokoiny ................ F28F 3/022 165/80.4
10,352,626 B2 * 7/2019 Kurashima ........... F28D 15/046
2008/0210407 A1 * 9/2008 Kim ...................... F28D 15/046 29/890.039
2012/0018130 A1 * 1/2012 Chang ..................... F28F 3/048 165/104.21

FOREIGN PATENT DOCUMENTS

CN 217280745 U * 8/2022

* cited by examiner

*Primary Examiner* — Terrell L McKinnon
(74) *Attorney, Agent, or Firm* — Li & Cai Intellectual Property Office

(57) ABSTRACT

A heat dissipation module is provided. The heat dissipation module includes a substrate, a heat dissipation unit, and an overflow prevention unit. The overflow prevention unit is disposed on a surface of the substrate. The overflow prevention unit is in a sheet shape and has a plurality of mesh holes.

4 Claims, 5 Drawing Sheets

HEAT DISSIPATION MODULE

CROSS-REFERENCE TO RELATED PATENT APPLICATION

This application claims the benefit of priority to Taiwan patent application Ser. No. 112201023, filed on Feb. 6, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a heat dissipation module, and more particularly to a heat dissipation module which has a heat dissipation unit capable of transforming to a liquid state.

BACKGROUND OF THE DISCLOSURE

Currently, common electronic components are developed and designed in the direction of miniaturization. In addition, central processing unit (CPU) or graphics processing unit (GPU) components are prone to generate high heat during actual operation due to factors such as miniaturization and greatly increased performance, which affects overall operational performance. Therefore, it is necessary to use micro-vapor chamber for heat dissipation.

As CPU manufacturing processes tend to be nanonized, and in pursuit of both higher performance and energy efficiency, CPUs are being manufactured with multiple cores. However, under operation at the turbo function, certain cores may generate extremely high heat energy, causing the CPU temperature to rise dramatically. In addition, after reaching the melting point, the metal thermal pad becomes molten and then gets thinner slowly due to the thermal shock. In absence of the reinforcement by other preservation structures and overflow prevention structures, breakage may gradually develop. Accordingly, the heat conduction between the heat dissipator and CPUs may gradually deteriorate, resulting in a loss of function. Further, uneven distribution of the heat generating sources may also cause unstable heat dissipation.

For another thing, the metal thermal pad with high thermal coefficients is required for effective heat dissipation. However, the overflow caused by the phase transformation of the metal thermal pad often leads to short circuiting of the motherboard, and the uneven distribution of the heat generating sources may also cause the unstable heat dissipation.

Conventionally, the silicon-based paste is applied around the heat generating sources to prevent the overflow, or the glue is dispensed onto the surrounding components to achieve solidification to prevent the short circuiting. However, such processes are time-consuming and labor-intensive for the production line, and the fixed dispensing equipment is required, resulting in increased costs and labors.

Therefore, how to improve a structural design to enhance heat dissipation effect of a heat dissipation module so as to overcome the above issues, has become one of the important issues to be addressed in the related field.

SUMMARY OF THE DISCLOSURE

In response to the above-referenced technical inadequacies, the present disclosure provides a heat dissipation module to improve the heat dissipation of the heat dissipation module and solve an overflowing problem of the metal thermal pad.

In order to solve the above-mentioned problems, one of the technical aspects adopted by the present disclosure is to provide a heat dissipation module, which includes a substrate, a heat dissipation unit, and an overflow prevention unit. The overflow prevention unit is in a sheet shape and has a plurality of mesh holes. The overflow prevention unit is disposed on a surface of the substrate, and each of the plurality of mesh holes is defined by six blocking structures. The heat dissipation unit is disposed on a surface of the overflow prevention unit away from the substrate. The substrate is configured to be disposed on a heat generating source.

In one of the possible or preferred embodiments, the heat dissipation unit has a first state and a second state, the first state is a solid state, and the second state is a liquid state.

In one of the possible or preferred embodiments, the heat dissipation unit is formed of a liquid metal of a thermal grease.

In one of the possible or preferred embodiments, the blocking structure has a first projection, a second projection, and a third projection.

In one of the possible or preferred embodiments, a length of the first projection, a length of the second projection, and a length of the third projection are the same.

In one of the possible or preferred embodiments, the first projection and the second projection have a first angle therebetween, the second projection and the third projection have a second angle therebetween, and the first projection and the third projection have a third angle therebetween.

In one of the possible or preferred embodiments, wherein, when each of the first angle, the second angle, and the third angle is 120°, the blocking structure is Y-shaped.

In one of the possible or preferred embodiments, the blocking structure is in the shape of an equilateral triangle.

In one of the possible or preferred embodiments, any two blocking structures that are adjacent to each other have a gap therebetween.

In one of the possible or preferred embodiments, a thickness of the overflow prevention unit is 100% to 120% of a thickness of the substrate.

Therefore, one of the beneficial effects of the present disclosure is that the heat dissipation module provided by the present disclosure can be applied in various microelectronic components. Due to the miniaturization of the CPU and the significant increase in performance, a sudden rise in the temperature of a single part of an electronic component often occurs. By virtue of a capillary phenomenon caused by the plurality of mesh holes of the overflow prevention unit, the heat dissipation unit can be effectively absorbed, which prevents the heat dissipation unit from flowing out. In addition, the blocking structures that are adjacent to each other have the gap therebetween so as to allow flowing of the heat dissipation unit between different mesh holes when the heat dissipation unit transforms form the first state to the second state. Such design can effectively adopt the flow property of the heat dissipation unit in the second state in cooperation with the characteristic that it is spatially communicable between the mesh holes, a problem of the sudden rise in the temperature of the single part of the electronic component can be effectively solved and the raised temperature can be effectively transferred, so that damage to the electronic component can be avoided.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
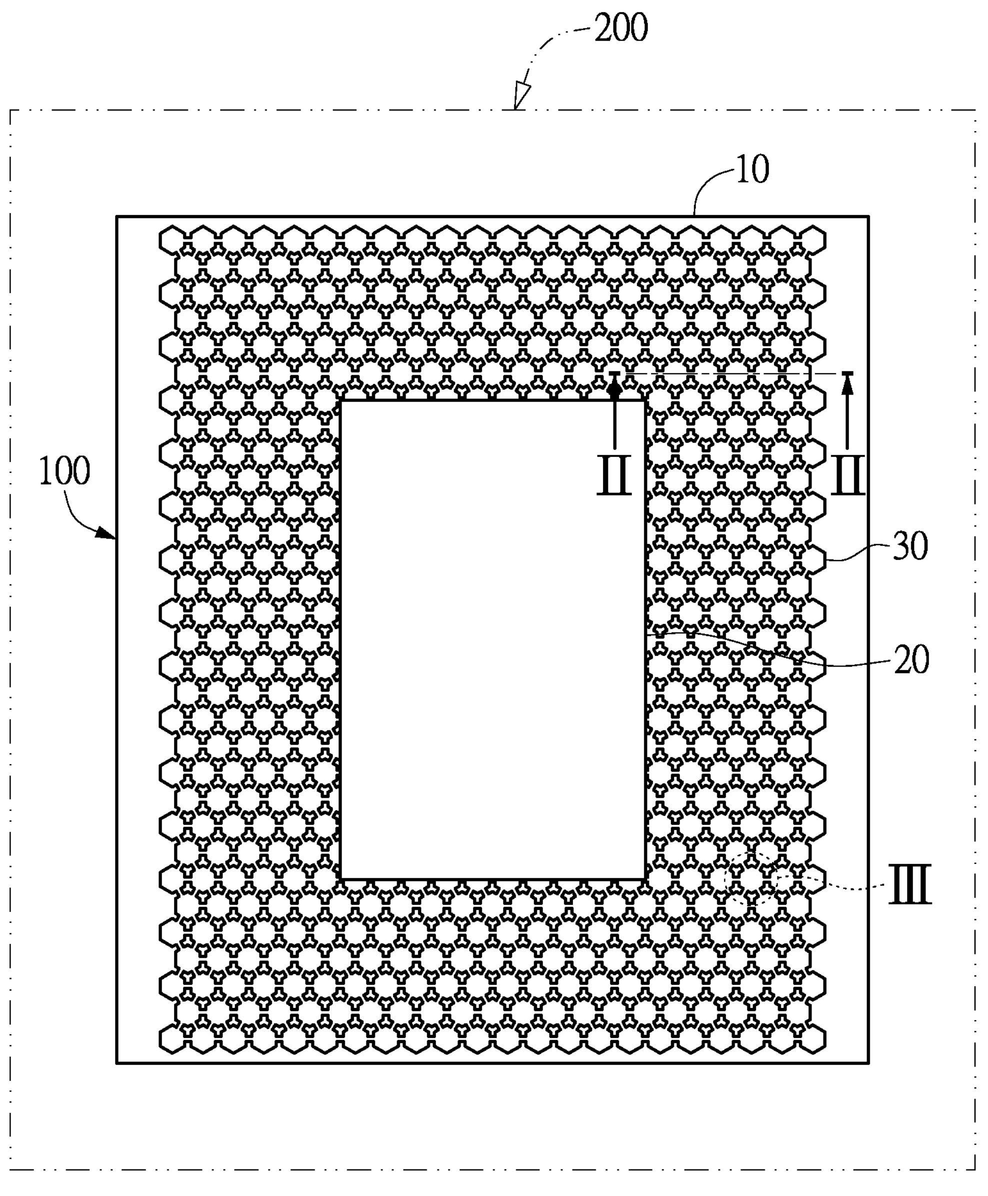
FIG. 1 is a schematic top view of a heat dissipation module according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Embodiments

Referring to FIG. 1 to FIG. 5, the present disclosure provides a heat dissipation module 100, which includes a substrate 10, a heat dissipation unit 20, and an overflow prevention unit 30. The substrate 10 is configured to carry the heat dissipation unit 20 and the overflow prevention unit 30, and the substrate is configured to be disposed on a heat generating source 200.

It should be noted that the substrate 10 of the heat dissipation module 100 is attached to the heat generating source 200. The heat generating source 200 can be disposed on a carrier substrate (not shown in the figures). The heat generating source 200 can be a central processing unit (CPU), a graphics processing unit (GPU), a microcontroller (MCU), a microprocessor (MPU), an application specific integrated circuit (ASIC), or other electronic components, but the present disclosure is not limited thereto.

The heat dissipation unit 20 can include a heat dissipating material with a high thermal dissipation coefficient, and has a first state and a second state. For example, the first state can be a solid state and the second state can be a liquid state, but the present disclosure is not limited thereto. When the heat dissipation unit 20 absorbs heat energy, the heat dissipation unit 20 can transform form the first state to the second state. In one particular embodiment, the heat dissipation unit 20 can be formed of a liquid metal or a thermal grease.

Figure 2:
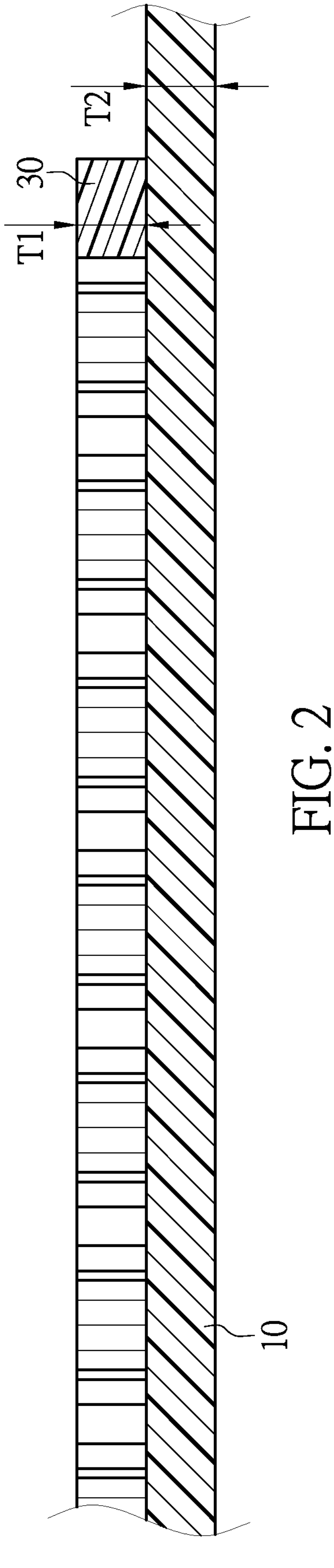
FIG. 2 is a cross-sectional view taken along line II-II of an overflow prevention unit and a substrate of FIG. 1.
Figure 3:
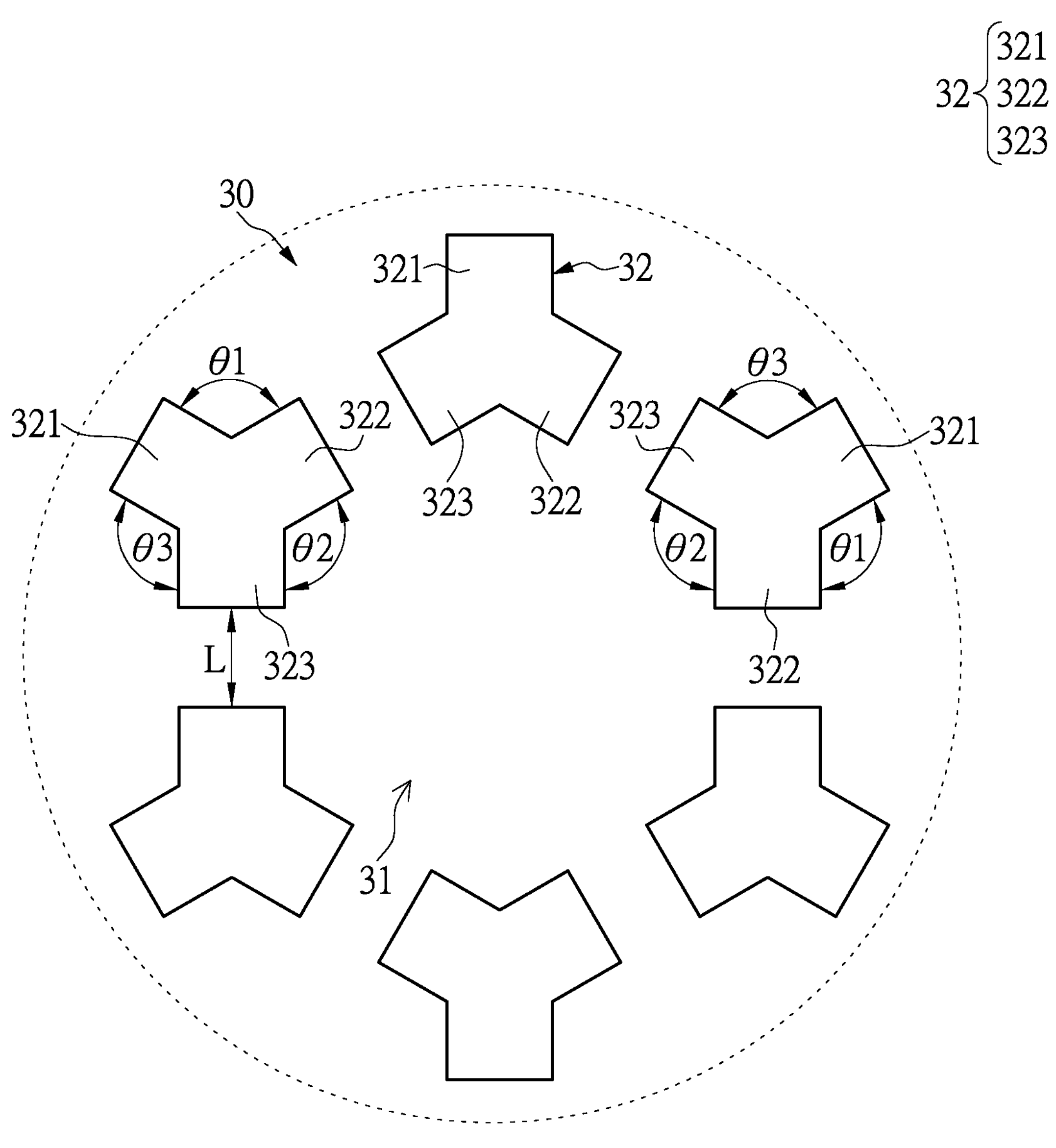
FIG. 3 is a schematic enlarged view of part III of FIG. 1.

As shown in FIG. 1 to FIG. 3, the overflow prevention unit 30 is disposed on a surface of the substrate 10, and the heat dissipation unit 20 is disposed on a surface of the overflow prevention unit 30 away from the substrate 10. The overflow prevention unit 30 is in a sheet shape and has a plurality of mesh holes 31. The overflow prevention unit 30 has an overflow prevention unit thickness T1, and the substrate 10 has a substrate thickness T2. The overflow prevention unit thickness T1 is between 0.1 mm and 0.3 mm. In one particular embodiment, the overflow prevention unit thickness T1 is 0.15 mm. The overflow prevention unit thickness T1 is 100% to 120% of the substrate thickness T2.

Referring to FIG. 3, each of the plurality of mesh holes 31 is defined by six blocking structures 32. Each blocking structure 32 has a first projection 321, a second projection 322, and a third projection 323. A length of the first projection 321, a length of the second projection 322, and a length of the third projection 323 can be the same or different, but the present disclosure is not limited thereto. In the present disclosure, the blocking structure 32 shown in FIG. 3 is an example in which the length of the first projection 321, the length of the second projection 322, and the length of the third projection 323 are the same. When the length of the first projection 321, the length of the second projection 322, and the length of the third projection 323 are the same, the mesh hole 31 is in a shape of a regular hexagon, such as a honeycomb.

Although the shapes of the plurality of mesh holes 31 can be regular hexagons, the length of the first projection 321, the length of the second projection 322, and the length of the third projection 323 of each blocking structures 32 on the same blocking overflow prevention unit 30 may be not the same. That is, one part of the mesh holes 31 on the same overflow prevention unit 30 can be in the shape of regular hexagons, and another part of the mesh holes 31 on the same overflow prevention unit 30 can be in the shape of hexagons. The present disclosure does not limit the shapes of the plurality of mesh holes 31 on the same overflow prevention unit 30 to be consistent.

Referring to FIG. 3, any two blocking structure 32 that are adjacent to each other has a gap L therebetween. Specifically, as shown in FIG. 3, the second projection 322 of an uppermost blocking structure 32 and the third projection 323 of an upper right blocking structure 32 have the gap L therebetween, and a width of the gap L is between 0.2 mm and 1.2 mm. In one particular embodiment, the width of the gap L is 0.5 mm.

Figure 4:
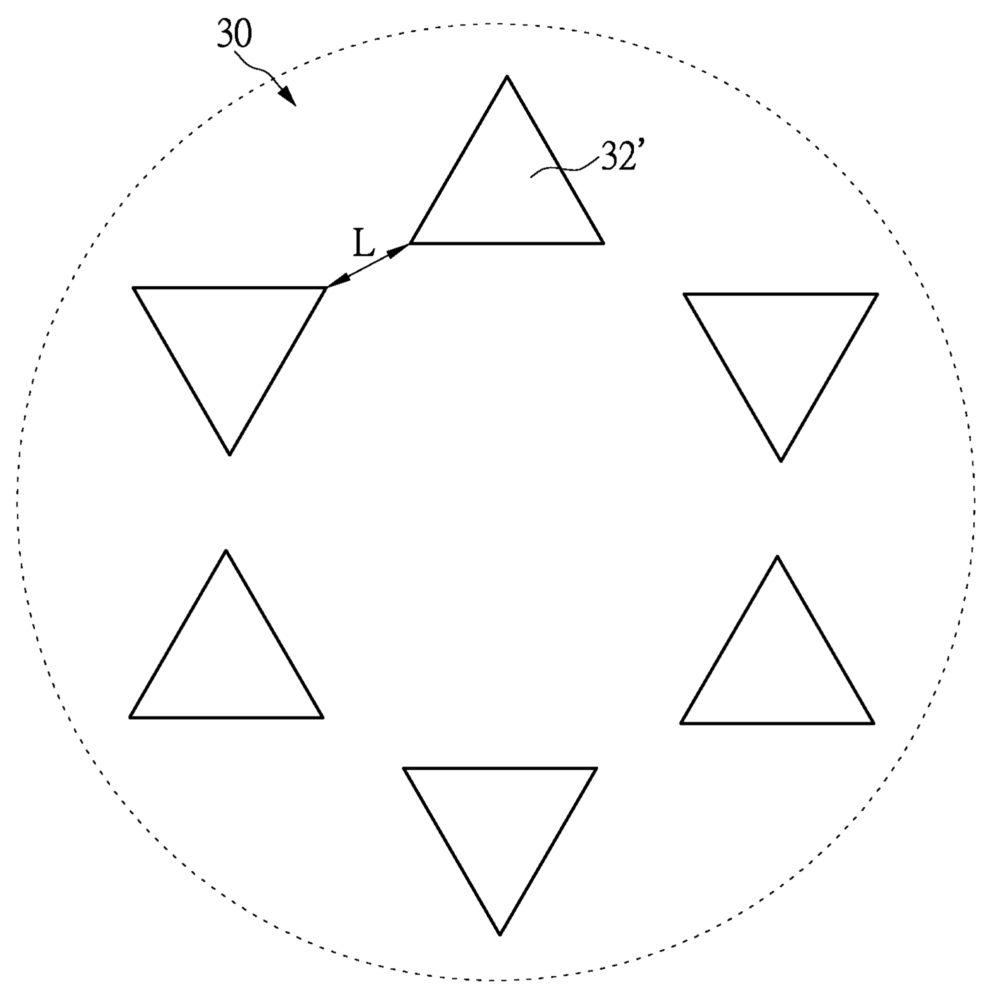
FIG. 4 is a schematic enlarged view of a blocking structure according to another embodiment.

On the same blocking structure 32, the first projection 321 and the second projection 322 have a first angle θ1 therebetween, the second projection 322 and the third projection 323 have a second angle θ2 therebetween, and the first projection 321 and the third projection 323 have a third angle θ3 therebetween. As shown in FIG. 3, when each of the first angle θ1, the second angle θ2, and the third angle θ3 is 120°, the blocking structure 32 is Y-shaped. As shown in FIG. 4, in one particular embodiment, a blocking structure 32' is in the shape of an equilateral triangle.

When the heat dissipation unit 20 is the liquid metal in the first state, a shape of the liquid metal can be rectangular, triangular, circular, or polygonal, but the present disclosure is not limited thereto.

Figure 5:
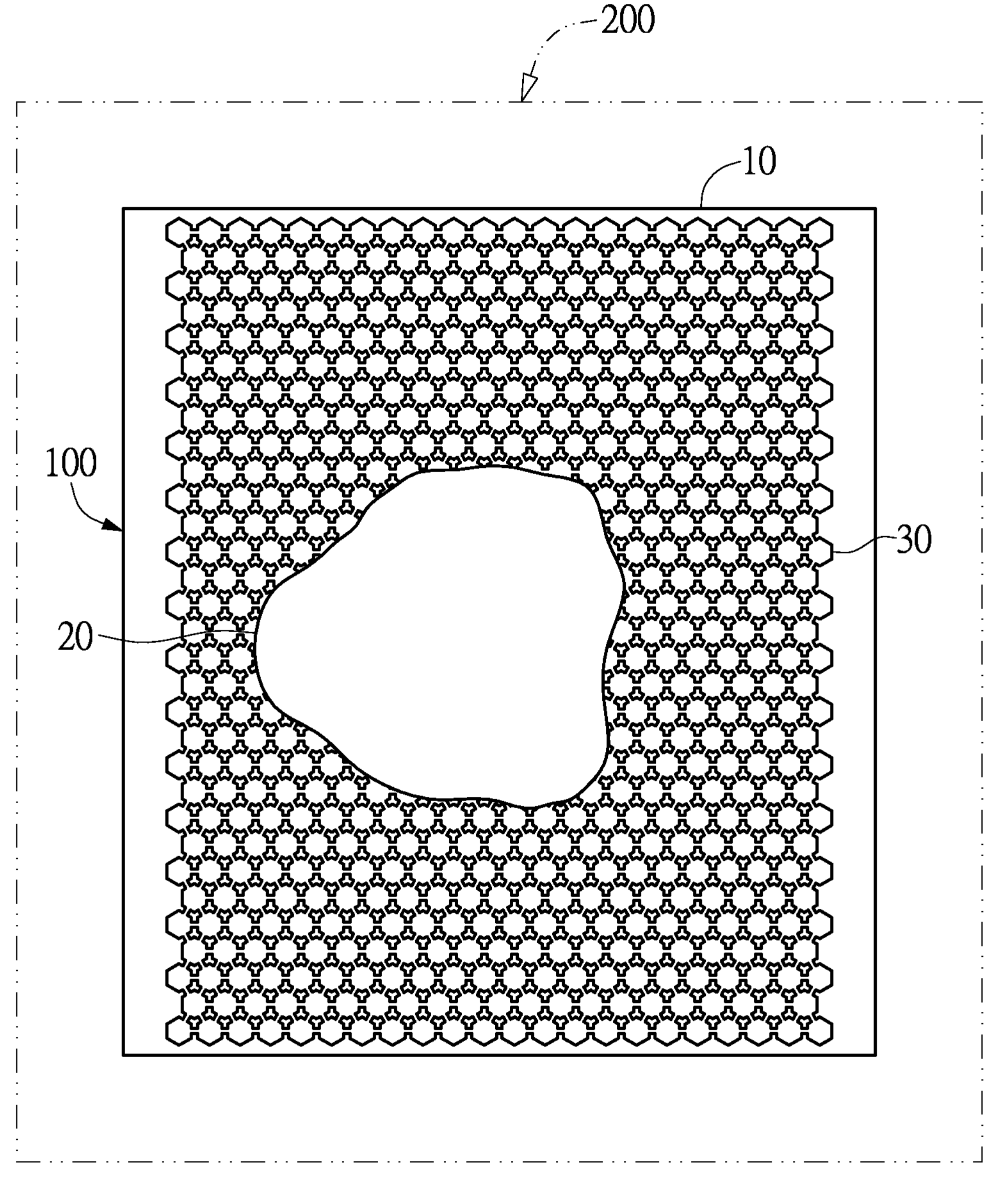
FIG. 5 is a schematic view showing a heat dissipation unit of the heat dissipation module in a second state according to the present disclosure.

Reference is made to FIG. 1 and FIG. 5, in which FIG. 1 shows the heat dissipation unit 20 is the liquid metal in the first state. When the heat dissipation unit 20 absorbs the heat energy and transforms from the first state (as shown in FIG. 1) to the second state (as shown in FIG. 5), the overflow prevention unit 30 can effectively prevent the heat dissipation unit 20 in the second from flowing out in a manner that the heat dissipation unit 20 in the second state is absorbed and solidified in the plurality of mesh holes 31 due to a capillary phenomenon caused by the plurality of mesh holes 31 of the overflow prevention unit 30. Therefore, when the heat dissipation unit 20 is about to overflow, the capillary phenomenon caused by the plurality of mesh holes 31 of the overflow prevention unit 30 can effectively prevent a short circuit problem of a motherboard caused by overflowing of the heat dissipation unit 20, and the heat dissipation unit 20 in the second state can further avoid unstable heat dissipation due to uneven distribution of the heat generating source 200.

Beneficial Effects of the Embodiments

In conclusion, one of the beneficial effects of the present disclosure is that the heat dissipation module provided by the present disclosure can be applied in various microelectronic components. Due to the miniaturization of the CPU and the significant increase in performance, a sudden rise in the temperature of a single part of an electronic component often occurs. By virtue of the capillary phenomenon caused by the plurality of mesh holes of the overflow prevention unit, the heat dissipation unit can be effectively absorbed, which prevents the heat dissipation unit from flowing out. In addition, the blocking structures that are adjacent to each other have the gap therebetween so as to allow flowing of the heat dissipation unit between different mesh holes when the heat dissipation unit transforms form the first state to the second state. Such design can effectively adopt the flow property of the heat dissipation unit in the second state in cooperation with the characteristic that it is spatially communicable between the mesh holes, a problem of the sudden rise in the temperature of the single part of the electronic component can be effectively solved and the raised temperature can be effectively transferred, so that damage to the electronic component can be avoided.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A heat dissipation module, comprising:

a substrate;

a heat dissipation unit; and an overflow prevention unit, the overflow prevention unit being in a sheet shape and having a plurality of mesh holes;

wherein the overflow prevention unit is disposed on a surface of the substrate, and each of the plurality of mesh holes is defined by six blocking structures to substantially form a regular hexagon;

wherein the plurality of blocking structures is arranged in a symmetrical pattern around each of the plurality of mesh holes;

wherein the heat dissipation unit is disposed on a surface of the overflow prevention unit away from the substrate;

wherein the substrate is configured to be disposed on a heat generating source;

wherein each of the blocking structures has a first projection, a second projection, and a third projection, and each of the first projection, the second projection, and the third projection has a planar top surface;

wherein a length of the first projection, a length of the second projection, and a length of the third projection are the same;

wherein the first projection and the second projection have a first angle therebetween, the second projection and the third projection have a second angle therebetween, and the first projection and the third projection have a third angle therebetween;

wherein, when each of the first angle, the second angle, and the third angle is 120°, the blocking structure is Y-shaped; and wherein any two of the blocking structures adjacent to each other define a gap between two of the planar top surfaces that are opposing to each other.

2. The heat dissipation module according to claim 1, wherein the heat dissipation unit has a first state and a second state, the first state is a solid state, and the second state is a liquid state.

3. The heat dissipation module according to claim 2, wherein the heat dissipation unit is formed of a liquid metal of a thermal grease.

4. The heat dissipation module according to claim 1, wherein a thickness of the overflow prevention unit is 100% to 120% of a thickness of the substrate.

* * * * *